(12) United States Patent
Tian et al.

(10) Patent No.: US 11,874,565 B2
(45) Date of Patent: Jan. 16, 2024

(54) DISPLAY SUBSTRATE, MANUFACTURING METHOD THEREOF AND DISPLAY PANEL

(71) Applicants: Beijing BOE Display Technology Co., Ltd., Beijing (CN); BOE Technology Group Co., Ltd., Beijing (CN)

(72) Inventors: Chunguang Tian, Beijing (CN); Tianyu Xia, Beijing (CN); Xiaolong Li, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 430 days.

(21) Appl. No.: 17/312,306

(22) PCT Filed: Dec. 30, 2020

(86) PCT No.: PCT/CN2020/141353
§ 371 (c)(1),
(2) Date: Jun. 9, 2021

(87) PCT Pub. No.: WO2021/190049
PCT Pub. Date: Sep. 30, 2021

(65) Prior Publication Data
US 2023/0359090 A1 Nov. 9, 2023

(30) Foreign Application Priority Data
Mar. 27, 2020 (CN) .......................... 202010229050.2

(51) Int. Cl.
*G02F 1/1343* (2006.01)
*G02F 1/1362* (2006.01)
*G02F 1/1333* (2006.01)

(52) U.S. Cl.
CPC .. *G02F 1/134309* (2013.01); *G02F 1/133345* (2013.01); *G02F 1/136286* (2013.01)

(58) Field of Classification Search
None
See application file for complete search history.

(56) References Cited

U.S. PATENT DOCUMENTS

2014/0184964 A1* 7/2014 Byeon ............... G02F 1/134309
349/138
2014/0291684 A1 10/2014 Kim
(Continued)

FOREIGN PATENT DOCUMENTS

CN 101364019 A 2/2009
CN 202948231 U 5/2013
(Continued)

OTHER PUBLICATIONS

CN2020102290502 First Office Action.
PCT/CN2020/141353 International Search Report and Written Opinion.

*Primary Examiner* — Richard H Kim
(74) *Attorney, Agent, or Firm* — IPro, PLLC

(57) ABSTRACT

A display substrate, a manufacturing method thereof and a display device are provided. The display substrate includes a display region and a peripheral region surrounding the display region, and includes: a common electrode line extending in a first direction on a base substrate and arranged at the display region and the peripheral region; a first conductive pattern arranged at the peripheral region and electrically connected to the common electrode line; an insulation layer covering the first conductive pattern and the common electrode line, a via-hole being formed in the insulation layer, an orthogonal projection of the via-hole onto the base substrate not overlapping an orthogonal projection of the common electrode line onto the base substrate; and a second conductive pattern arranged at the peripheral region and at a side of the insulation layer distal to the first (Continued)

conductive pattern, and electrically connected to the first conductive pattern through the via-hole.

20 Claims, 3 Drawing Sheets

(56) References Cited

U.S. PATENT DOCUMENTS

| | | |
|---|---|---|
| 2015/0014658 A1 | 1/2015 | Choung et al. |
| 2015/0294986 A1 | 10/2015 | Moon et al. |
| 2017/0068136 A1 | 3/2017 | Byeon et al. |
| 2018/0197890 A1 | 7/2018 | Yan |
| 2019/0267400 A1 | 8/2019 | Xian et al. |
| 2021/0208457 A1* | 7/2021 | Son .................... G02F 1/13394 |

FOREIGN PATENT DOCUMENTS

| | | |
|---|---|---|
| CN | 103345092 A | 10/2013 |
| CN | 103869512 A | 6/2014 |
| CN | 103913905 A | 7/2014 |
| CN | 103969859 A | 8/2014 |
| CN | 206074968 U | 4/2017 |
| CN | 106886107 A | 6/2017 |
| CN | 110047422 A | 7/2019 |
| CN | 111290156 A | 6/2020 |

* cited by examiner

DISPLAY SUBSTRATE, MANUFACTURING METHOD THEREOF AND DISPLAY PANEL

CROSS-REFERENCE TO RELATED APPLICATION

This application is the U.S. national phase of PCT application No. PCT/CN2020/141353 filed on Dec. 30, 2020, which claims a priority of the Chinese patent application No. 202010229050.2 filed in China on Mar. 27, 2020, which are incorporated herein by reference in their entireties.

TECHNICAL FIELD

The present disclosure relates to the field of display technology, in particular to a display substrate, a manufacturing method thereof, and a display panel.

BACKGROUND

Currently, in a Liquid Crystal Display (LCD) device, a display substrate is provided with a common electrode line to which a common voltage Vcom is applied, so as to transmit a common voltage signal to a common electrode. In the related art, a size of a display device becomes larger and larger, so it is necessary to provide a common electrode bus outside a display region to connect the common electrode lines, thereby to apply a same common voltage Vcom to the common electrode lines, and improve display uniformity of the display device.

SUMMARY

An object of the present disclosure is to provide a display substrate, a manufacturing method thereof and a display panel.

In one aspect, the present disclosure provides in some embodiments a display substrate, including a display region and a peripheral region surrounding the display region, wherein the display substrate includes:
a common electrode line extending in a first direction on a base substrate, wherein the common electrode line is arranged at both the display region and the peripheral region;
a first conductive pattern arranged at the peripheral region and electrically connected to the common electrode line;
an insulation layer covering the first conductive pattern and the common electrode line, wherein a via-hole is formed in the insulation layer, and an orthogonal projection of the via-hole onto the base substrate does not overlap an orthogonal projection of the common electrode line onto the base substrate; and
a second conductive pattern arranged at the peripheral region and at a side of the insulation layer distal to the first conductive pattern, wherein the second conductive pattern is electrically connected to the first conductive pattern through the via-hole.

In a possible embodiment of the present disclosure, the common electrode line is a copper line.

In a possible embodiment of the present disclosure, the first conductive pattern is arranged at a side of the common electrode line adjacent to the base substrate, or the first conductive pattern is arranged at a side of the common electrode line distal to the base substrate.

In a possible embodiment of the present disclosure, the display substrate further includes a common electrode bus arranged at the peripheral region and surrounding the display region. The common electrode bus is arranged at a side of the insulation layer distal to the first conductive pattern and electrically connected to the second conductive pattern, and the first direction is perpendicular to the second direction.

In a possible embodiment of the present disclosure, the second conductive pattern is arranged at a side of the common electrode bus distal to the base substrate, or the second conductive pattern is arranged at a side of the common electrode bus adjacent to the base substrate.

In a possible embodiment of the present disclosure, the display region includes a gate line and a data line;
the common electrode line is arranged parallel to the gate line and arranged at a same layer and made of a same material as the gate line;
the common electrode bus is arranged at a same layer and made of a same material as the data line.

In a possible embodiment of the present disclosure, the display region further includes pixel regions defined by the gate lines and the data lines, each of the pixel regions includes a pixel electrode and a common electrode;
the first conductive pattern is arranged at a same layer and made of a same material as the common electrode;
the second conductive pattern is arranged at a same layer and made of a same material as the pixel electrode.

In another aspect, the present disclosure provides in some embodiments a display panel including the above-mentioned display panel.

In yet another aspect, the present disclosure provides a method for manufacturing a display substrate, including:
providing a base substrate, the base substrate including a display region and a peripheral region surrounding the display region;
forming on the base substrate a common electrode line and a first conductive pattern electrically connected to each other, the common electrode line extending in a first direction and arranged at both the display region and the peripheral region, the first conductive pattern being arranged at the peripheral region;
forming an insulation layer covering the first conductive pattern and the common electrode line, a via-hole being formed in the insulation layer, an orthogonal projection of the via-hole onto the base substrate not overlapping an orthogonal projection of the common electrode line onto the base substrate;
forming a second conductive pattern on the insulation layer, the second conductive pattern being electrically connected to the first conductive pattern through the via-hole.

In a possible embodiment of the present disclosure, the forming on the base substrate the common electrode line and the first conductive pattern electrically connected to each other includes:
forming the first conductive pattern on the base substrate, and forming the common electrode line at the display region and on a part of the first conductive pattern; or
forming the common electrode line on the base substrate, and forming the first conductive pattern at the peripheral region and on a part of the common electrode line.

In a possible embodiment of the present disclosure, prior to forming the second conductive pattern on the insulation layer, the method further includes:
forming a common electrode bus on the insulation layer, the common electrode bus being at the peripheral region;

the forming the second conductive pattern on the insulation layer includes:
forming the second conductive pattern at the peripheral region and on a part of the common electrode bus.

In a possible embodiment of the present disclosure, the forming the common electrode line includes:
forming at the display region both a gate line extending in a first direction and the common electrode line parallel to the gate line through a single patterning process.

In a possible embodiment of the present disclosure, the forming the common electrode bus includes:
forming both a data line extending in a second direction at the display region and the common electrode bus at the peripheral region through a single patterning process.

In a possible embodiment of the present disclosure, the forming the first conductive pattern includes:
forming both a common electrode at the display region and the first conductive pattern at the peripheral region through a single patterning process.

In a possible embodiment of the present disclosure, the forming the second conductive pattern includes:
forming both a pixel electrode at the display region and the second conductive pattern at the peripheral region through a single patterning process.

DETAILED DESCRIPTION

In the following, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
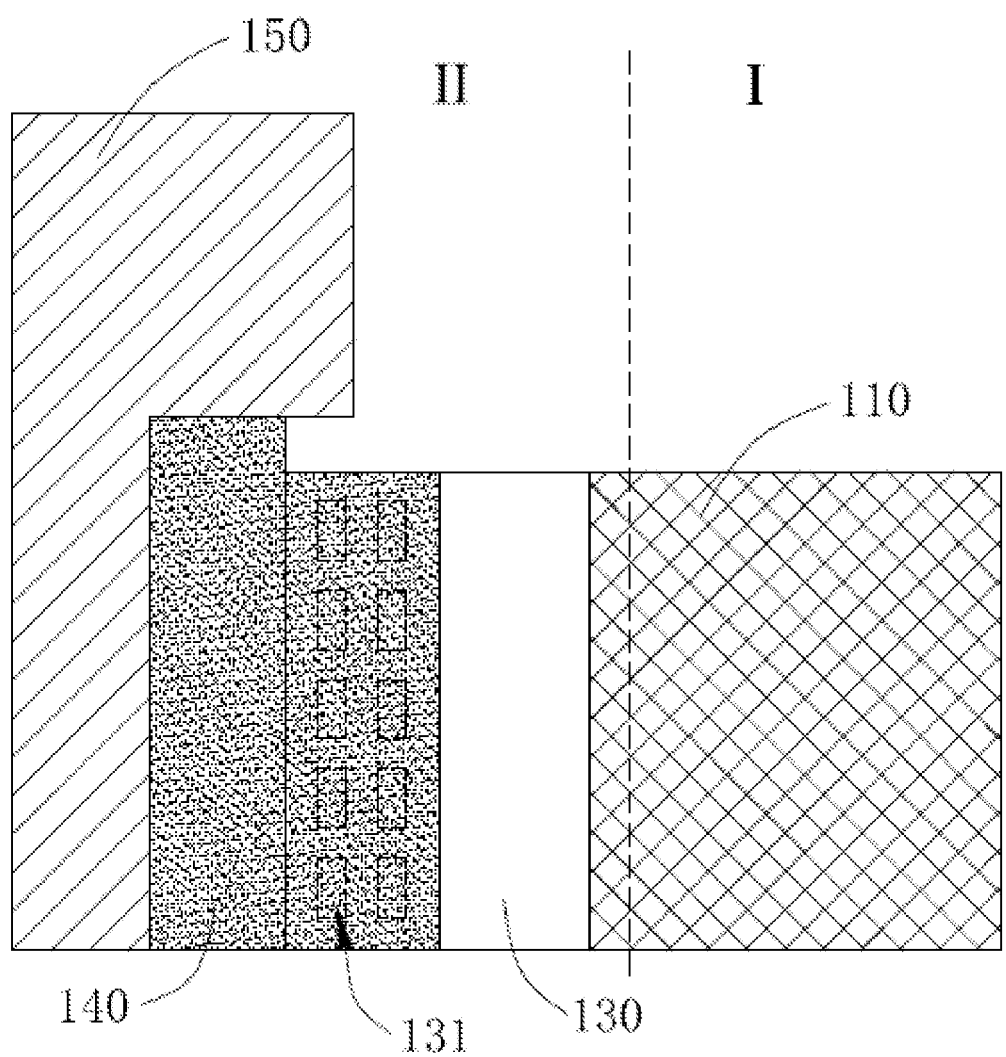
FIG. 1 is a top view of a display substrate according to an embodiment of the present disclosure.
Figure 2:
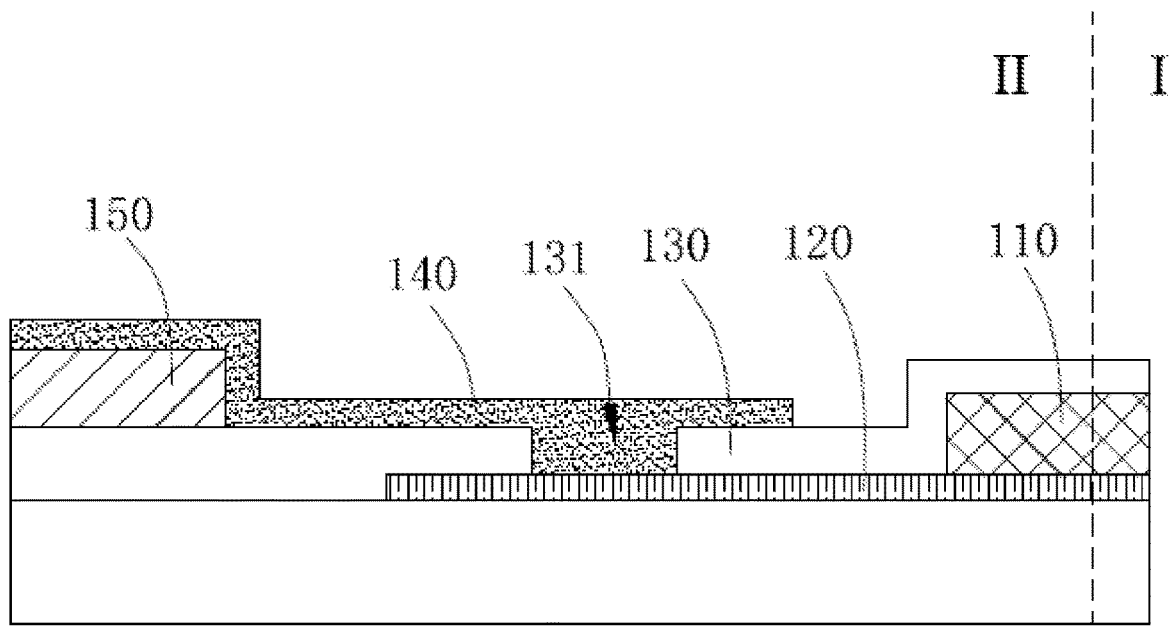
FIG. 2 is a sectional view of the display substrate according to an embodiment of the present disclosure.

The present disclosure provides in some embodiments a display substrate which, as shown in FIGS. 1 and 2, includes a display region I and a peripheral region II surrounding the display region I. The display substrate includes:
a common electrode line 110 extending in a first direction on a base substrate and arranged at both the display region and the peripheral region;
a first conductive pattern 120 arranged at the peripheral region and electrically connected to the common electrode line 110;
an insulation layer 130 covering the first conductive pattern 120 and the common electrode line 110, a via-hole 131 being formed in the insulation layer 130, an orthogonal projection of the via-hole 131 onto the base substrate not overlapping an orthogonal projection of the common electrode line 110 onto the base substrate;
a second conductive pattern 140 arranged at the peripheral region and at a side of the insulation layer 130 distal to the first conductive pattern 120, and electrically connected to the first conductive pattern 120 through the via-hole 131.

According to the embodiments of the present disclosure, through the first conductive pattern electrically connected to the common electrode line and the second conductive pattern electrically connected to the first conductive pattern through the via-hole, it enable that, at the peripheral region, the common electrode line may be electrically connected to the common electrode bus at another layer, so it is able to apply a same common voltage to the common electrode lines, thereby to improve the display uniformity of the display device. Therefore, according to the present disclosure, it is able to apply a same common voltage to the common electrode lines, thereby to improve the display uniformity of the display device.

In FIG. 1, a part of the insulation layer 130 adjacent to the display region I is removed, so as to observe the common electrode line 110.

The quantity of common electrode lines 110 may be plural, i.e., the plurality of common electrode lines 110 extending in the first direction may be arranged parallel to each other on the base substrate. A part of each common electrode line 110 at the display region I may be connected to a common electrode at a pixel region.

A plurality of pixel regions may be arranged in an array form at the display region I. The first direction may be parallel to a row direction or a column direction in the array, which will not be particularly defined herein. When the first direction is parallel to the row direction in the array, common electrodes at the pixel regions in a same row may be electrically connected to a same common electrode line 110.

There may exist one portion of each common electrode line 110 at the peripheral region II, i.e., the common electrode line 110 may include two portions connected to each other, with a first portion being located at the display region I and a second portion being located at the peripheral region II. The second portion may provide a common voltage from the common electrode bus at the peripheral region II to the first portion, and this common voltage may serve as a reference voltage applied to the common electrodes connected to the first portion. A common voltage signal may be transmitted from the second portion to the first portion. There may also exist two portions of the common electrode line 110 at the peripheral region II, i.e., the common electrode line 110 may include three portions connected to each other, with a first portion being located at the display region I and the other two second portions being located at respective two opposite portions of the peripheral region II. The two second portions at respective two opposite portions of the peripheral region II may provide the common voltage from the common electrode bus at the peripheral region II simultaneously to the first portion, and this common voltage may serve as a reference voltage applied to the common electrodes connected to the first portion. The common voltage signal may be transmitted from the two second portions to the first portion simultaneously.

When there are two second portions of the common electrode line 110 at the peripheral region II, two ends of the common electrode line may together provide the common voltage signal to the first portion at the display region I, so as to reduce a transmission distance of the common voltage signal and reduce a voltage loss, thereby to further improve the display uniformity of the display device.

The first conductive pattern 120 may be arranged at the peripheral region II, and it may be used to connect each common electrode line 110 to the common electrode bus, so as to improve the display uniformity of the display substrate.

The insulation layer 130 may be an organic insulation layer or an inorganic insulation layer. The orthogonal projection of the via-hole 131 in the insulation layer 130 onto the base substrate may not overlap the orthogonal projection of the common electrode line 110 onto the base substrate and may overlap an orthogonal projection of the first conductive pattern 120 onto the base substrate.

The second conductive pattern 140 may be arranged at the peripheral region II. One end of the second conductive pattern 140 may be electrically connected to the first conductive pattern 120 through the via-hole, and the other end thereof may be directly connected to the common electrode bus or indirectly connected to the common electrode bus via another conductive pattern, which will not be particularly defined herein.

It should be appreciated that, the common electrode bus may be arranged at the peripheral region II and at a first side of the display region I. Each common electrode line 110 may include the first portion at the display region I and the second portions at a first side of the first portion, and the second portions may be electrically connected to the common electrode bus through the first conductive pattern 120 and the second conductive pattern 140. The common electrode bus may also be a closed pattern arranged at the peripheral region II and surrounding the display region I, each common electrode line 110 may include the first portion at the display region I and the second portions at the peripheral region II. The second portions may be arranged at any end or both ends of the first portion in the first direction, and each second portion may be electrically connected to the common electrode bus through the first conductive pattern 120 and the second conductive pattern 140.

Further, each common electrode line may be a copper line.

Copper has excellent electrical conductivity, and as compared with the other metal conductive materials such as aluminum, it may be used to reduce a time delay for the signal transmission as well as a resistance of the line, thereby to reduce power consumption of the display device.

However, copper is relatively active, and when the common electrode line 110 is a copper line and the orthogonal projection of the via-hole in the insulation layer 130 onto the base substrate overlaps the common electrode line, copper may be exposed to the outside through the via-hole and thereby its property may change due to chemical reaction. At this time, there may exist a relatively high contact resistance at a joint where the second conductive pattern 140 is connected to the common electrode line 110 through the via-hole, and thereby such an abnormality as heating may occur at the joint during the display.

As shown in FIG. 2, through the first conductive pattern 120, it is able to prevent the property of the common electrode line made of copper from being changed due to being directly exposed to the outside, provide a small contact resistance at the joint between the common electrode line and the second conducive pattern 140, and prevent the occurrence of the abnormality, e.g., heating, at the joint during the display, thereby to improve the reliability of the display device.

Further, the first conductive pattern may be arranged at a side of the common electrode line adjacent to the base substrate, or at a side of the common electrode line distal to the base substrate.

In the embodiments of the present disclosure, the first conductive pattern 120 may be arranged at a side of the common electrode line 110 adjacent to the base substrate, i.e., the first conductive pattern 120 may be formed on the base substrate, and then the common electrode line connected to the first conductive pattern 120 may be formed on the substrate. In addition, the first conductive pattern 120 may also be arranged at a side of the common electrode line 110 distal to the base substrate, i.e., the common electrode line may be formed on the base substrate, and then the first conductive pattern 120 connected to the common electrode line may be formed on the base substrate.

As shown in FIGS. 1 and 2, the display substrate may further include the common electrode bus arranged at the peripheral region and surrounding the display region. The common electrode bus may be arranged at a side of the insulation layer distal to the first conductive pattern and electrically connected to the second conductive pattern, and the first direction may be perpendicular to a second direction.

In the embodiments of the present disclosure, the common electrode bus 160 may be a closed pattern arranged at the peripheral region II and surrounding the display region I.

A portion of each common electrode line 110 extending to the peripheral region II may be electrically connected to the common electrode bus 150 through the first conductive pattern 120 and the second conductive pattern 140.

Further, the second conductive pattern 140 may be arranged at a side of the common electrode bus 150 distal to the base substrate, or at a side of the common electrode bus 150 adjacent to the base substrate.

In the embodiments of the present disclosure, the second conductive pattern 140 may be arranged at a side of the common electrode bus 150 adjacent to the base substrate, i.e., the second conductive pattern 140 may be formed on the base substrate, and then the common electrode bus 150 connected to the second conductive pattern 140 may be formed on the base substrate. In addition, the second conductive pattern 140 may also be arranged at a side of the common electrode bus 150 distal to the base substrate, i.e., the common electrode bus 150 may be formed on the base substrate, and then the second conductive pattern 140 connected to the common electrode bus 150 may be formed on the base substrate.

Figure 3:
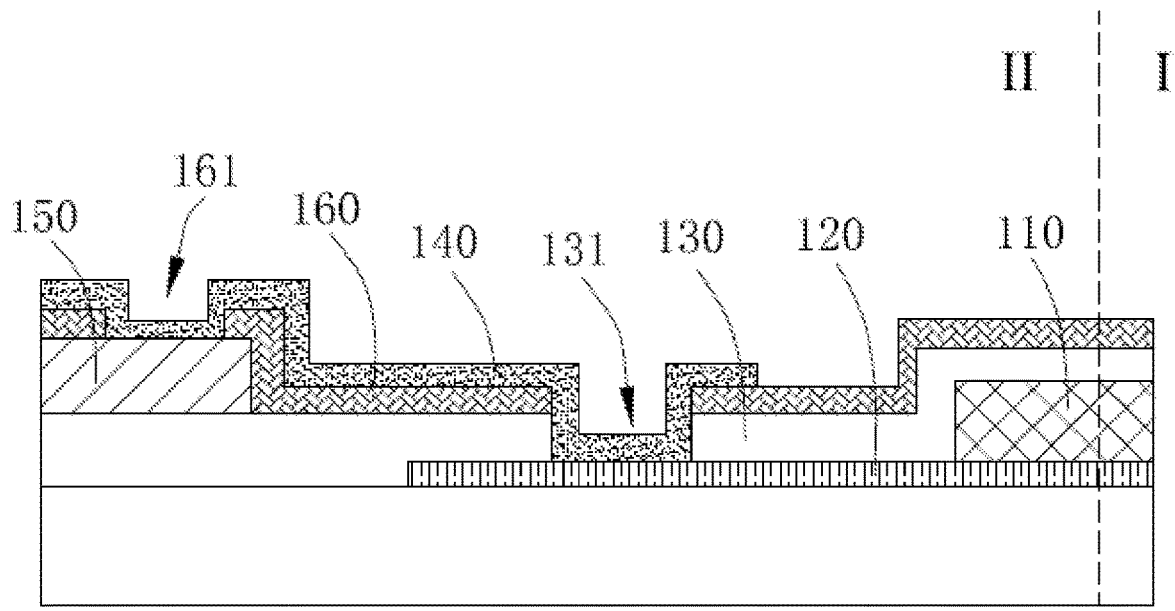
FIG. 3 is a sectional view of the display substrate according to another embodiment of the present disclosure.

The second conductive pattern 140 and the common electrode bus 150 may be both arranged at a side of the insulation layer 130 distal to the base substrate, and an inorganic passivation layer 160 may be further arranged between the second conductive pattern 140 and the common electrode bus 150, as shown in FIG. 3. In FIG. 3, the common electrode bus 150 may be arranged between the second conductive pattern 140 and the base substrate, and the inorganic passivation layer 161 may be arranged between the second conductive pattern 140 and the common electrode bus 150. A via-hole 161 may be formed in, and penetrate through, the inorganic passivation layer 160, and the second conductive pattern 140 may be electrically connected to the common electrode bus 150 through the via-hole 161.

Figure 4:
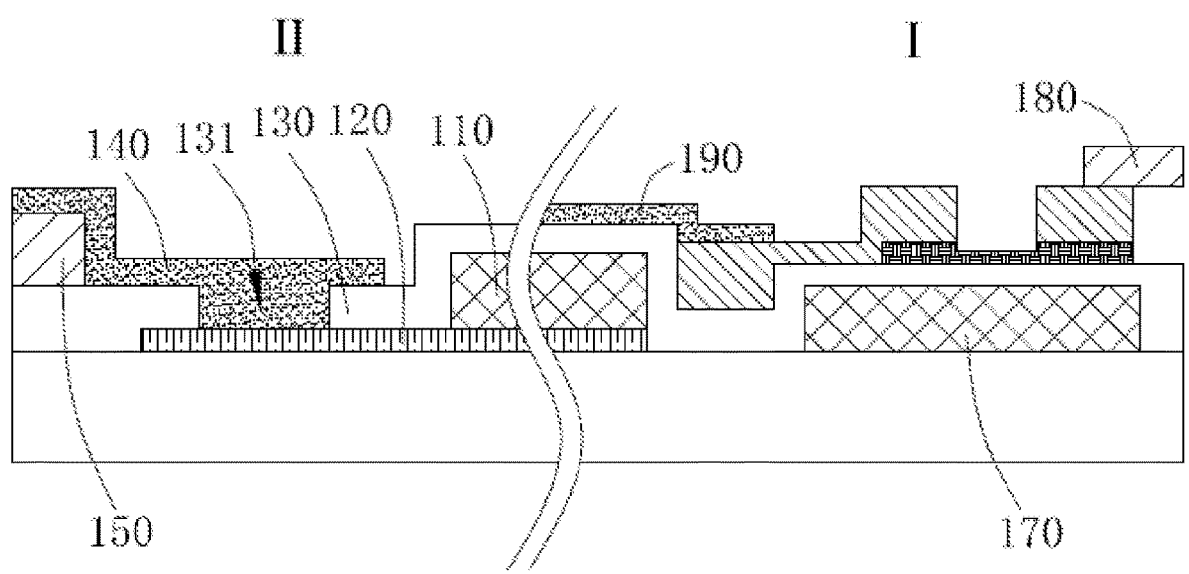
FIG. 4 is a sectional view of the display substrate according to yet another embodiment of the present disclosure.

Further, as shown in FIG. 4, the display region I may include gate lines 170 and data lines 180;

each common electrode line 110 may be arranged parallel to the gate line 170, and arranged at a same layer and made of a same material as the gate line 170;

the common electrode bus 150 may be arranged at a same layer, and made of a same material, as the data line 180.

In the embodiments of the present disclosure, each common electrode line 110 at the display region I and the peripheral region II and each gate line 170 at the display region I may be formed through a single patterning process, i.e., a whole first conductive material layer may be applied onto the base substrate, exposed through a mask 1 and then etched to simultaneously acquire the common electrode lines 110 and the gate lines 170 parallel to each other. At this time, the common electrode lines 110 and the gate lines 170 may be made of a first conductive material and arranged at a layer where the first conductive material layer is located.

The first conductive material may be copper. When the gate line 170 is a copper line, it is able to reduce a time delay for the transmission of a scanning signal as well as a resistance of the gate line, thereby to reduce the power consumption of the display device.

The common electrode bus 150 at the peripheral region II and the data lines 180 at the display region I may be formed simultaneously through a single patterning process, i.e., a whole second conductive material layer may be applied to the base substrate, exposed with a mask 2, and etched to simultaneously acquire the data lines 180 at the display region I and the common electrode bus 150 at the peripheral region II and surrounding the display region I. At this time, the common electrode bus 150 and the data lines 180 may be made of a second conductive material, and arranged at a layer where the second conductive material layer is located.

In the embodiments of the present disclosure, when the gate lines 170 are arranged at a same layer and made of a same material as the common electrode lines 110, it is able to reduce the quantity of steps for manufacturing the display substrate and reduce a tact time. Identically, when the data lines 180 are arranged at a same layer and made of a same material as the common electrode bus 150, it is also able to reduce the quantity of steps for manufacturing the display substrate and reduce a tact time.

As shown in FIG. 4, the display region I further includes pixel regions defined by the gate lines 170 and the data lines 180, and each pixel region includes a pixel electrode 190 and a common electrode (not shown);
the first conductive pattern 120 may be arranged at a same layer and made of a same material as the common electrode;
the second conductive pattern 140 may be arranged at a same layer and made of a same material as the pixel electrode 190.

In the embodiments of the present disclosure, the first conductive pattern 120 at the peripheral region II and the common electrode at each pixel region in the display region I may be simultaneously formed through a single patterning process, i.e., a whole third conductive material layer may be applied to the base substrate, exposed with a mask 3, and then etched to simultaneously acquire the first conductive pattern 120 at the peripheral region II and the common electrode at the display region I. At this time, the first conductive pattern 120 and the common electrode may be made of a third conductive material, and arranged at a layer where the third conductive material layer is located.

The second conductive pattern 140 at the peripheral region II and the pixel electrode 190 at each pixel region in the display region I may be simultaneously formed through a single patterning process, i.e., a whole fourth conductive material layer may be applied to the base substrate, exposed with a mask plate 4, and then etched to simultaneously acquire the second conductive pattern 140 at the peripheral region II and the pixel electrode at the display region I. At this time, the second conductive pattern 140 and the pixel electrode 190 may be made of a third conductive material, and arranged at a layer where the third conductive material layer is located.

In the embodiments of the present disclosure, when the first conductive pattern 120 is arranged at a same layer and made of a same material as the common electrode, it is able to reduce the quantity of steps for manufacturing the display substrate and reduce a tact time. Identically, when the second conductive pattern 140 is arranged at a same layer and made of a same material as the pixel electrode 190, it is also able to reduce the quantity of steps for manufacturing the display substrate and reduce a tact time.

The present disclosure further provides in some embodiments a display panel which includes the above-mentioned display substrate.

The present disclosure further provides in some embodiments a method for manufacturing a display substrate, which includes:
providing a base substrate, the base substrate including a display region and a peripheral region surrounding the display region;
forming a common electrode line and a first conductive pattern electrically connected to each other on the base substrate, the common electrode line extending in a first direction and arranged at both the display region and a part of the peripheral region, the first conductive pattern being arranged at the peripheral region;
forming an insulation layer covering the first conductive pattern and the common electrode line, a via-hole being formed in the insulation layer, an orthogonal projection of the via-hole onto the base substrate not overlapping an orthogonal projection of the common electrode line onto the base substrate;
forming a second conductive pattern on the insulation layer, the second conductive pattern being electrically connected to the first conductive pattern through the via-hole.

According to the embodiments of the present disclosure, through the first conductive pattern electrically connected to the common electrode line and the second conductive pattern electrically connected to the first conductive pattern through the via-hole, it enables that, at the peripheral region, the common electrode line may be electrically connected to the common electrode bus at another layer, so it is able to apply a same common voltage to the common electrode lines, thereby to improve the display uniformity of the display device. Therefore, according to the present disclosure, it is able to apply a same common voltage to the common electrode lines, thereby to improve the display uniformity of the display device.

As shown in FIGS. 1 and 2, the quantity of common electrode lines 110 may be plural, i.e., the plurality of common electrode lines 110 extending in the first direction may be arranged parallel to each other on the base substrate. A part of each common electrode line 110 at the display region I may be connected to a common electrode at a pixel region.

A plurality of pixel regions may be arranged in an array form at the display region I. The first direction may be parallel to a row direction or a column direction in the array, which will not be particularly defined herein. When the first direction is parallel to the row direction in the array, common electrodes at the pixel regions in a same row may be electrically connected to a same common electrode line 110.

There may exist one portion of each common electrode line 110 at the peripheral region II, i.e., the common electrode line 110 may include two portions connected to each other, with a first portion being located at the display region I and a second portion being located at the peripheral region II. The second portion may provide a common voltage from the common electrode bus at the peripheral region II to the first portion, and this common voltage may serve as a reference voltage applied to the common electrodes connected to the first portion. A common voltage signal may be transmitted from the second portion to the first portion. There may also exist two portions of the common electrode line 110 at the peripheral region II, i.e., the common electrode line 110 may include three portions connected to each other, with a first portion being located at the display region I and the other two second portions being located at respective two opposite portions of the peripheral region II. The two second portions at respective two opposite portions of the peripheral region II may provide the common voltage from the common electrode bus at the peripheral region II simultaneously to the first portion, and this common voltage may serve as a reference voltage applied to the common electrodes connected to the first portion. The common voltage signal may be transmitted from the two second portions to the first portion simultaneously.

When there are two second portions of the common electrode line 110 at the peripheral region II, two ends of the common electrode line may together provide the common voltage signal to the first portion at the display region I, so as to reduce a transmission distance of the common voltage signal and reduce a voltage loss, thereby to further improve the display uniformity of the display device.

The first conductive pattern 120 may be arranged at the peripheral region II, and it may be used to connect each common electrode line 110 to the common electrode bus, so as to improve the display uniformity of the display substrate.

The insulation layer 130 may be an organic insulation layer or an inorganic insulation layer. The orthogonal projection of the via-hole 131 in the insulation layer 130 onto the base substrate may not overlap the orthogonal projection of the common electrode line 110 onto the base substrate and may overlap an orthogonal projection of the first conductive pattern 120 onto the base substrate.

The second conductive pattern 140 may be arranged at the peripheral region II. One end of the second conductive pattern 140 may be electrically connected to the first conductive pattern 120 through the via-hole, and the other end thereof may be directly connected to the common electrode bus or indirectly connected to the common electrode bus via another conductive pattern, which will not be particularly defined herein.

It should be appreciated that, the common electrode bus may be arranged at the peripheral region II and at a first side of the display region I. Each common electrode line 110 may include the first portion at the display region I and the second portions at a first side of the first portion, and the second portions may be electrically connected to the common electrode bus through the first conductive pattern 120 and the second conductive pattern 140. The common electrode bus may also be a closed pattern arranged at the peripheral region II and surrounding the display region I, each common electrode line 110 may include the first portion at the display region I and the second portions at the peripheral region II. The second portions may be arranged at any end or both ends of the first portion in the first direction, and each second portion may be electrically connected to the common electrode bus through the first conductive pattern 120 and the second conductive pattern 140.

Each common electrode line may be a copper line.

Copper has excellent electrical conductivity, and as compared with the other metal conductive materials such as aluminum, it may be used to reduce a time delay for the signal transmission as well as a resistance of the line, thereby to reduce power consumption of the display device.

However, copper is relatively active, and when the common electrode line 110 is a copper line and the orthogonal projection of the via-hole in the insulation layer 130 onto the base substrate overlaps the first common electrode line, copper may be exposed to the outside through the via-hole and thereby its property may change due to chemical reaction. At this time, there may exist a relatively high contact resistance at a joint where the second conductive pattern 140 is connected to the common electrode line 110 through the via-hole, and thereby such an abnormality as heating may occur at the joint during the display.

As shown in FIG. 2, through the first conductive pattern 120, it is able to prevent the property of the common electrode line made of copper from being changed due to being directly exposed to the outside, provide a small contact resistance at the joint between the common electrode line and the second conducive pattern 140, and prevent the occurrence of the abnormality, e.g., heating, at the joint during the display, thereby to improve the reliability of the display device.

Further, the forming the common electrode line and the first conductive pattern electrically connected to each other on the base substrate may include:
  forming the first conductive pattern on the base substrate, and forming the common electrode line at the display region and on a part of the first conductive pattern; or
  forming the common electrode line on the base substrate, and forming the first conductive pattern at the peripheral region and on a part of the common electrode line.

In the embodiments of the present disclosure, the first conductive pattern 120 may be formed at first, and then the common electrode line 110 connected to the first conductive pattern 120 may be formed on the base substrate, i.e., the first conductive pattern 120 may be arranged at a side of the common electrode line adjacent to the base substrate.

Alternatively, the common electrode line 110 may be formed at first, and then the first conductive pattern 120 connected to the common electrode line 110 may be formed on the base substrate, i.e., the first conductive pattern 120 may be arranged at a side of the common electrode line 110 distal to the base substrate.

Prior to forming the second conductive pattern on the insulation layer, the method may further include:
  forming a common electrode bus on the insulation layer and at the peripheral region;
  the forming the second conductive pattern on the insulation layer may include:
  forming the second conductive pattern at the peripheral region and on a part of the common electrode bus.

In the embodiments of the present disclosure, the common electrode bus 150 may be formed at first, and then the second conductive pattern 140 connected to the common electrode bus 150 may be formed on the base substrate, i.e., the second conductive pattern 140 may be arranged at a side of the common electrode bus 150 distal to the base substrate.

Further, the forming the common electrode line may include:
  forming a gate line extending in a first direction and the common electrode line parallel to the gate line at the display region through a single patterning process.

In the embodiments of the present disclosure, each common electrode line 110 at the display region I and the peripheral region II and each gate line 170 at the display region I may be formed through a single patterning process, i.e., a first conductive material layer may be applied onto the base substrate, exposed through a mask 1 and then etched to simultaneously acquire the common electrode lines 110 and the gate lines 170 parallel to each other. At this time, the common electrode lines 110 and the gate lines 170 may be made of a first conductive material and arranged at a layer where the first conductive material layer is located.

When the gate line 170 is arranged at a same layer and made of a same material as the common electrode line 110, it is able to reduce the quantity of steps for manufacturing the display substrate, thereby to reduce a tact time.

Further, the forming the common electrode bus may include:

forming a data line 180 extending in a second direction at the display region and the common electrode bus at the peripheral region through a single patterning process.

In the embodiments of the present disclosure, the common electrode bus 150 at the peripheral region II and the data lines 180 at the display region I may be formed simultaneously through a single patterning process, i.e., a whole second conductive material layer may be applied to the base substrate, exposed with a mask 2, and etched to simultaneously acquire the data lines 180 at the display region I and the common electrode bus 150 at the peripheral region II and surrounding the display region I. At this time, the common electrode bus 150 and the data lines 180 may be made of a second conductive material, and arranged at a layer where the second conductive material layer is located.

When the data line 180 is arranged at a same layer and made of a same material as the common electrode bus 150, it is able to reduce the quantity of steps for manufacturing the display substrate, thereby to reduce a tact time.

Further, the forming the first conductive pattern may include:

forming a common electrode at the display region and the first conductive pattern at the peripheral region through a single patterning process.

In the embodiments of the present disclosure, the first conductive pattern 120 at the peripheral region II and the common electrode at the display region I may be simultaneously formed through a single patterning process, i.e., a whole third conductive material layer may be applied to the base substrate, exposed with a mask 3, and then etched to simultaneously acquire the first conductive pattern 120 at the peripheral region II and the common electrode at the display region I. At this time, the first conductive pattern 120 and the common electrode may be made of a third conductive material, and arranged at a layer where the third conductive material layer is located.

When the first conductive pattern 120 is arranged at a same layer and made of a same material as the common electrode, it is able to reduce the quantity of steps for manufacturing the display substrate, thereby to reduce a tact time.

Further, the forming the first conductive pattern may include:

forming a common electrode at the display region and the first conductive pattern at the peripheral region through a single patterning process.

In the embodiments of the present disclosure, the second conductive pattern 140 at the peripheral region II and the pixel electrode 190 at each pixel region in the display region I may be simultaneously formed through a single patterning process, i.e., a whole fourth conductive material layer may be applied to the base substrate, exposed with a mask plate 4, and then etched to simultaneously acquire the second conductive pattern 140 at the peripheral region II and the display electrode at the display region I. At this time, the second conductive pattern 140 and the pixel electrode 190 may be made of a third conductive material, and arranged at a layer where the third conductive material layer is located.

When the second conductive pattern 140 is arranged at a same layer and made of a same material as the pixel electrode 190, it is able to reduce the quantity of steps for manufacturing the display substrate, thereby to reduce a tact time.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. It should be noted that, a person skilled in the art may make further modifications and improvements without departing from the principle of the present disclosure, and these modifications and improvements shall also fall within the scope of the present disclosure.

What is claimed is:

1. A display substrate, comprising a display region and a peripheral region surrounding the display region, wherein the display substrate comprises:
    a common electrode line extending in a first direction on a base substrate, wherein the common electrode line is arranged at both the display region and the peripheral region;
    a first conductive pattern arranged at the peripheral region and electrically connected to the common electrode line;
    an insulation layer covering the first conductive pattern and the common electrode line, wherein a via-hole is formed in the insulation layer, and an orthogonal projection of the via-hole onto the base substrate does not overlap an orthogonal projection of the common electrode line onto the base substrate; and
    a second conductive pattern arranged at the peripheral region and at a side of the insulation layer distal to the first conductive pattern, wherein the second conductive pattern is electrically connected to the first conductive pattern through the via-hole.

2. The display substrate according to claim 1, wherein the common electrode line is a copper line.

3. The display substrate according to claim 1, wherein the first conductive pattern is arranged at a side of the common electrode line adjacent to the base substrate, or the first conductive pattern is arranged at a side of the common electrode line distal to the base substrate.

4. The display substrate according to claim 1, further comprising a common electrode bus arranged at the peripheral region and surrounding the display region, wherein the common electrode bus is arranged at a side of the insulation layer distal to the first conductive pattern and electrically connected to the second conductive pattern, and the first direction is perpendicular to the second direction.

5. The display substrate according to claim 4, wherein the second conductive pattern is arranged at a side of the common electrode bus distal to the base substrate, or the second conductive pattern is arranged at a side of the common electrode bus adjacent to the base substrate.

6. The display substrate according to claim 4, wherein the display region comprises a gate line and a data line;
the common electrode line is arranged parallel to the gate line and arranged at a same layer and made of a same material as the gate line;
the common electrode bus is arranged at a same layer and made of a same material as the data line.

7. The display substrate according to claim 6, wherein the display region further comprises pixel regions defined by the gate lines and the data lines, each of the pixel regions comprises a pixel electrode and a common electrode;
the first conductive pattern is arranged at a same layer and made of a same material as the common electrode;
the second conductive pattern is arranged at a same layer and made of a same material as the pixel electrode.

8. A display panel, comprising the display substrate according to claim 1.

9. The display panel according to claim 8, wherein the common electrode line is a copper line.

10. The display panel according to claim 8, wherein the first conductive pattern is arranged at a side of the common electrode line adjacent to the base substrate, or the first conductive pattern is arranged at a side of the common electrode line distal to the base substrate.

11. The display panel according to claim 8, wherein the display substrate further comprises a common electrode bus arranged at the peripheral region and surrounding the display region, wherein the common electrode bus is arranged at a side of the insulation layer distal to the first conductive pattern and electrically connected to the second conductive pattern, and the first direction is perpendicular to the second direction.

12. The display panel according to claim 11, wherein the second conductive pattern is arranged at a side of the common electrode bus distal to the base substrate, or the second conductive pattern is arranged at a side of the common electrode bus adjacent to the base substrate.

13. The display panel according to claim 11, wherein the display region comprises a gate line and a data line;
the common electrode line is arranged parallel to the gate line and arranged at a same layer and made of a same material as the gate line;
the common electrode bus is arranged at a same layer and made of a same material as the data line.

14. A method for manufacturing a display substrate, comprising:
providing a base substrate, the base substrate comprising a display region and a peripheral region surrounding the display region;
forming on the base substrate a common electrode line and a first conductive pattern electrically connected to each other, the common electrode line extending in a first direction and arranged at both the display region and the peripheral region, the first conductive pattern being arranged at the peripheral region;
forming an insulation layer covering the first conductive pattern and the common electrode line, a via-hole being formed in the insulation layer, an orthogonal projection of the via-hole onto the base substrate not overlapping an orthogonal projection of the common electrode line onto the base substrate;
forming a second conductive pattern on the insulation layer, the second conductive pattern being electrically connected to the first conductive pattern through the via-hole.

15. The method according to claim 14, wherein the forming on the base substrate the common electrode line and the first conductive pattern electrically connected to each other comprises:
forming the first conductive pattern on the base substrate, and forming the common electrode line at the display region and on a part of the first conductive pattern; or
forming the common electrode line on the base substrate, and forming the first conductive pattern at the peripheral region and on a part of the common electrode line.

16. The method according to claim 14, wherein prior to forming the second conductive pattern on the insulation layer, the method further comprises:
forming a common electrode bus on the insulation layer, the common electrode bus being at the peripheral region;
the forming the second conductive pattern on the insulation layer comprises:
forming the second conductive pattern at the peripheral region and on a part of the common electrode bus.

17. The method according to claim 14, wherein the forming the common electrode line comprises:
forming at the display region both a gate line extending in a first direction and the common electrode line parallel to the gate line through a single patterning process.

18. The method according to claim 16, wherein the forming the common electrode bus comprises:
forming both a data line extending in a second direction at the display region and the common electrode bus at the peripheral region through a single patterning process.

19. The method according to claim 14, wherein the forming the first conductive pattern comprises:
forming both a common electrode at the display region and the first conductive pattern at the peripheral region through a single patterning process.

20. The method according to claim 14, wherein the forming the second conductive pattern comprises:
forming both a pixel electrode at the display region and the second conductive pattern at the peripheral region through a single patterning process.

* * * * *